(12) United States Patent
Goto et al.

(10) Patent No.: US 6,222,754 B1
(45) Date of Patent: Apr. 24, 2001

(54) DIGITAL SIGNAL RECORDING/REPRODUCING METHOD

(75) Inventors: Toshio Goto; Takashi Yamaji, both of Tsurugashima (JP)

(73) Assignee: Pioneer Electronics Corporation, Tokyo (JP)

( * ) Notice: Subject to any disclaimer, the term of this patent is extended or adjusted under 35 U.S.C. 154(b) by 0 days.

(21) Appl. No.: 09/270,510

(22) Filed: Mar. 17, 1999

(30) Foreign Application Priority Data

Mar. 20, 1998 (JP) .................................................. 10-072738

(51) Int. Cl.[7] .................................................. G11C 13/04
(52) U.S. Cl. ........................... 365/125; 365/215; 365/216
(58) Field of Search .................................. 365/125, 215, 365/216, 124

(56) References Cited

U.S. PATENT DOCUMENTS

| 5,450,218 | * | 9/1995 | Heanue et al. | 365/125 |
| 5,519,517 | * | 5/1996 | Redfield et al. | 365/125 |
| 5,671,090 | * | 9/1997 | Pernick et al. | 365/216 |

* cited by examiner

Primary Examiner—Huan Hoang
(74) Attorney, Agent, or Firm—Sughrue, Mion, Zinn, Macpeak & Seas, PLLC

(57) ABSTRACT

Digital signal sequences to be recorded in predetermined unitary recording areas are transformed into blocks, a plurality of bit data carrying all digit levels to be read and determined upon reproduction are included in the resultant blocks, and sequences of the data blocks are recorded in the recording medium in the unitary recording areas. Upon reproduction, the blocks of the read signals obtained from a recording medium are recognized, a threshold value is determined for each block on the basis of the values of read signals corresponding to bit data carrying all digit levels to be read and determined, and each digit level of bit data in the read signal are read and determined on the basis of the threshold values.

38 Claims, 19 Drawing Sheets

○ : ADJUSTING BIT FOR "1", "0"

● : ADJUSTING BIT WITH LEVEL FLUCTUATION DUE TO NOISE d : INFORMATION BIT

*d* : INFORMATION BIT WITH LEVEL FLUCTUATION DUE TO NOISE

–·– : BLOCK BOUNDARIES

FIG.15

□ : REFERENCE DATA "1"

■ : REFERENCE DATA "0"

d : INFORMATION BIT

⊠ : REFERENCE DATA WITH LEVEL FLUCTUATION DUE TO NOISE

*d* : INFORMATION BIT WITH LEVEL FLUCTUATION DUE TO NOISE

⋮ : BLOCK BOUNDARY

FIG.18

| NORMAL RECORDING PAGE | REFERENCE PAGE |
|---|---|
| 2 ~ 5 | 1 |
| 6 ~ 15 | 11 |
| 16 ~ 25 | 21 |
| ⋮ | ⋮ |
| $10n-4$ ~ $10n+5$ | $10(n-1)+1$ |

DIGITAL SIGNAL RECORDING/REPRODUCING METHOD

BACKGROUND OF THE INVENTION

1. Field of the Invention

The present invention relates generally to an information recording/reproducing method, and more particularly to a method of recording a digital signal on a recording medium and reproducing the digital signal therefrom.

2. Description of the Related Art

A holographic memory system, which is one of information recording/reproduction systems mentioned above, records a digital signal (hereinafter called "data") on a holographic memory medium (a photo-refractive crystal material such as $LiNbO_3$ or the like) and reproducing the data therefrom. The system is capable of recording and reproducing data in a form of two-dimensional plane page, and moreover capable of recording and reproducing over a large number of pages. An exemplary configuration of the system is illustrated in FIG. 1.

Referring to FIG. 1, an encoder 11 converts time series recording data sequences to be recorded into a "page" in a holographic memory medium 1. In other words, the encoder 11 rearranges the time series recording data into a data matrix corresponding to a two-dimensional unitary plane page as a predetermined unitary recording region, for example, in a matrix of vertically 480 bits and horizontally 640 bits (480×640) to produce unitary page data sequence. The unitary page data sequence is sent to a spatial light modulator (SLM) 12.

The SLM 12 optically modulates an irradiated signal beam in accordance with the unitary page data sequence from the encoder 11 in modulation processing units of vertically 480 pixels×horizontally 640 pixels corresponding to the unitary page, and leads a modulated beam resulting therefrom to a lens 13. More specifically, the SLM 12 passes a signal beam therethrough in response to a logical value "1" in the unitary page data sequence, which is an electrical signal, and blocks the signal beam in response to a logical value "0," to achieve electrical-optical transducing in accordance with the respective bit contents in the unitary page data to produce a modulated signal beam as an optical signal representing the unitary page sequence.

Such a modulated signal beam is input to the holographic memory medium 1 through the lens 13. The holographic memory medium 1 is also irradiated with a reference beam having an angle from a predetermined reference line (hereinafter, called the "incident angle $\beta$") orthogonal to the optical axis of the beam carrying the optical signal, other than the modulated signal beam.

When the modulated signal beam and the reference beam are simultaneously incident on the holographic memory medium 1, both beams interfere with each other within the holographic memory medium 1 to produce an interference pattern which is recorded in the holographic memory medium 1, thereby recording the data in the holographic memory medium 1. Also, by inputting the reference beam with a different incident angle $\beta$, data can be recorded in the holographic memory medium 1 in units of predetermined three-dimensional recording regions including a plurality of pages of two-dimensional data.

For reproducing recorded data from the holographic memory medium 1, unlike recording, no signal beam is input to the holographic memory medium 1, but the reference beam only is input at the same incident angle $\beta$ as that used during the recording. In this way, diffracted light from an interference pattern recorded in the holographic memory medium 1 is led to a lens 21.

The diffracted light reaching the lens 21 passes through the lens 21, and impinges on a CCD (Charge-Coupled Device) 22 having a light receiving area of vertically 480 pixels×horizontally 640 pixels. Each of the pixels in the light receiving area of the CCD 22 corresponds to each pixel on a recording plane in the holographic memory medium 1, so that the CCD 22 transduces the brightness of the incident light in each pixel area into the magnitude of an electrical signal level, i.e., generates an analog electrical signal indicative of a level corresponding to the luminance of incident light, and supplies the analog electrical signal to a decoder 23 as a read signal.

The decoder 23 has a function of digitizing the read signal or performing binary determination, and recognizes a logical value "1" when the read signal has a level higher than a slice level serving as a threshold value, and a logical value "0" when lower than the level to produce a digital signal which carries the values thus recognized. In addition, the decoder 23 performs a reverse conversion of conversion performed in the encoder 11 to the digital signal to produce time series reproduced signal.

The holographic memory system thus configured is capable of recording and reproducing three-dimensional data including a temporal element to and from the holographic memory medium 1 by changing an incident angle $\beta$ of a reference beam at arbitrary time intervals, as well as recording and reproducing planar two-dimensional data in vertical and horizontal dimensions.

However, a variety of factors such as dust and stain on each optical elements, crosstalk, interference fringes and so on may cause the light intensity to spatially and temporally fluctuate, resulting in fluctuations due to noise in amplitude occurring in the output of the CCD, i.e., a read signal, other than a change in amplitude due to data itself. When the output of the CCD 22 is converted to data of "1" or "0" based on a fixed slice level in the decoder 23, data read errors may occur owing to amplitude fluctuations.

By way of example, assume that an image carrying a two-dimensional data matrix as illustrated in FIG. 2 is recorded in the holographic memory medium 1.

In FIG. 2, a white portion represents data "1," while a black portion represents data "0." If an irregular luminance illustrated in FIG. 3 is superimposed on the pattern image carrying such data, a read signal is produced on the basis of a pattern image as illustrated in FIG. 4. In this case, an amplitude value of a read signal in a data "1" portion is affected by "dark" or lower luminance irregularity to become smaller.

In FIG. 4, when a portion free from a "dark" region due to the irregular luminance indicated by an arrow A is sliced in the horizontal direction, and is represented as a change in the output level of light received by the CCD 22 corresponding to the sliced portion, i.e., a change in the level of the read signal, a waveform as shown in FIG. 5 is derived.

In FIG. 5, by determining whether the read signal is "1" or "0" based on a slice level defined by a median value between a maximum value and a minimum value of the read signal, recorded data "1, 0, 1, 0, 1, 0, 1, 0, 1, 0, 1, 0, 1, 0, 1" can be correctly reproduced as reproduced data "1, 0, 1, 0, 1, 0, 1, 0, 1, 0, 1, 0, 1, 0, 1."

However, if a portion including a "dark" region due to irregular luminance indicated by an arrow B is sliced in the horizontal direction, and a read signal from that portion is determined whether it is "1" or "0" with the same slice level as FIG. 5, recorded data is not correctly reproduced because a level corresponding to the "dark" region is lower than the slice level as shown in FIG. 6, so that the reproduced data represents "1, 0, 1, 0, 1, 0, 0, 0, 0, 0, 0, 0, 1, 0, 1," thus resulting in a read error.

While FIG. 6 shows an example where the level of a read signal corresponding to data "1" becomes lower due to a "dark" region of the irregular luminance to result in a read error, the level of a read signal corresponding to data "0" may become higher due to a "light" region of irregular luminance to cause a read error, as shown in FIG. 7.

Also, as shown in FIGS. 8 and 9, data cannot be correctly reproduced if the entire level of a read signal fluctuates with an offset due to the irregular luminance to cause a read error.

In the case shown in FIGS. 8, 9, while a large offset may result in the level of a read signal exceeding an upper limit of data "1" or falling below a lower limit of data "0," the level is limited by the respective upper limit or the lower limit.

OBJECT AND SUMMARY OF THE INVENTION

The present invention has been made in view of the problem mentioned above, and its object is to provide a digital signal recording method, reproducing method and recording/reproducing method which are capable of reliably reproducing a recorded digital signal even if a read signal is experiencing level level fluctuations due to noise.

To achieve the above object, a method of recording a plurality of digital signal sequences at predetermined unitary recording areas in a recording medium, respectively, according to the present invention comprises the steps of transforming each of the digital signal sequences to be recorded into blocks, including a plurality of bit data carrying all digit levels to be read and determined upon reproduction within each of the resultant data blocks, and recording a sequence of the data blocks at the corresponding ones of the predetermined unitary recording areas in the recording medium.

A method of reproducing digital signal sequences from a recording medium according to the present invention comprises the steps of recognizing blocks in each of read signal sequences obtained from the recording medium, determining a threshold value for each block on the basis of read values of bit data carrying all digit levels to be read and determined, and reading and determining a digit level of each bit of the read signal sequences on the basis of the threshold value.

Another method of recording a plurality of digital signal sequences at predetermined unitary recording areas in a recording medium, respectively, according to the present invention comprises the steps of transforming each of the digital signal sequences to be recorded into blocks, locating reference bit data carrying at least first and second digit levels to be read and determined upon reproduction at respective predetermined positions in each of the resultant data blocks, and recording a sequence of the data blocks at the corresponding ones of the predetermined unitary recording areas in the recording medium.

Another method of reproducing digital signal sequences from a recording medium according to the present invention comprises the steps of recognizing blocks in each of read signal sequences obtained from the recording medium, determining a threshold value for each of the blocks on the basis of read values of reference bit data carrying at least first and second digit levels to be read and determined, the reference bit data being located at predetermined positions within each of the block, and reading and determining a digit level of each bit of the read signal sequences on the basis of the threshold value.

In one embodiment of the recording method, the data block may be formed of the number of bits corresponding to a vertical length by which a recording plane in the recording medium is divided, and the number of bits corresponding to a horizontal length by which the recording plane in the recording medium is divided.

Alternatively, the data block may be formed of the number of bits corresponding to a vertical length by which a recording plane in the recording medium is divided, the number of bits corresponding to a horizontal length by which the recording plane in the recording medium is divided, and the number of bits corresponding to a recording time interval for a recording area defined by both of the numbers of bits.

A further method of recording a plurality of digital signal sequences at predetermined unitary recording areas in a recording medium, respectively, according to the present invention comprises the steps of preparing correction digital signals each corresponding to each of the predetermined unitary recording areas and each including bit data carrying digit levels to be determined upon reproduction and having a predetermined bit position relationship corresponding to the digit levels, mixing each of the correction digital signals with each of the digital signal sequences, and recording the resultant digital signal sequences at the corresponding ones of the predetermined unitary recording areas in the recording medium.

A further A method of reproducing digital signal sequences from a recording medium according to the present invention comprises the steps of recognizing correction digital signals for each of predetermined unitary recording areas from the read signal sequences obtained from the recording medium, identifying bit data carrying digit levels to be read and determined from the correction digital signals on the basis of a predetermined bit position relationship thereof, detecting deviation values from the respective expected values of the identified bit data, and correcting values of each bit of the digital signal sequences on the basis of the deviation values.

BRIEF DESCRIPTION OF THE DRAWINGS

FIG. 15 is a diagram illustrating an example of a data pattern for a unitary recording page for explaining in detail the data reproduction processing of FIG. 14;

FIG. 18 is a diagram showing a corresponding relationship of recording page data sequence composed by encoding processing according to a third embodiment of the present invention.

DETAILED DESCRIPTION OF THE PREFERRED EMBODIMENTS

Several embodiments of the present invention will hereinafter be described in detail with reference to the accompanying drawings.

Figure 1:
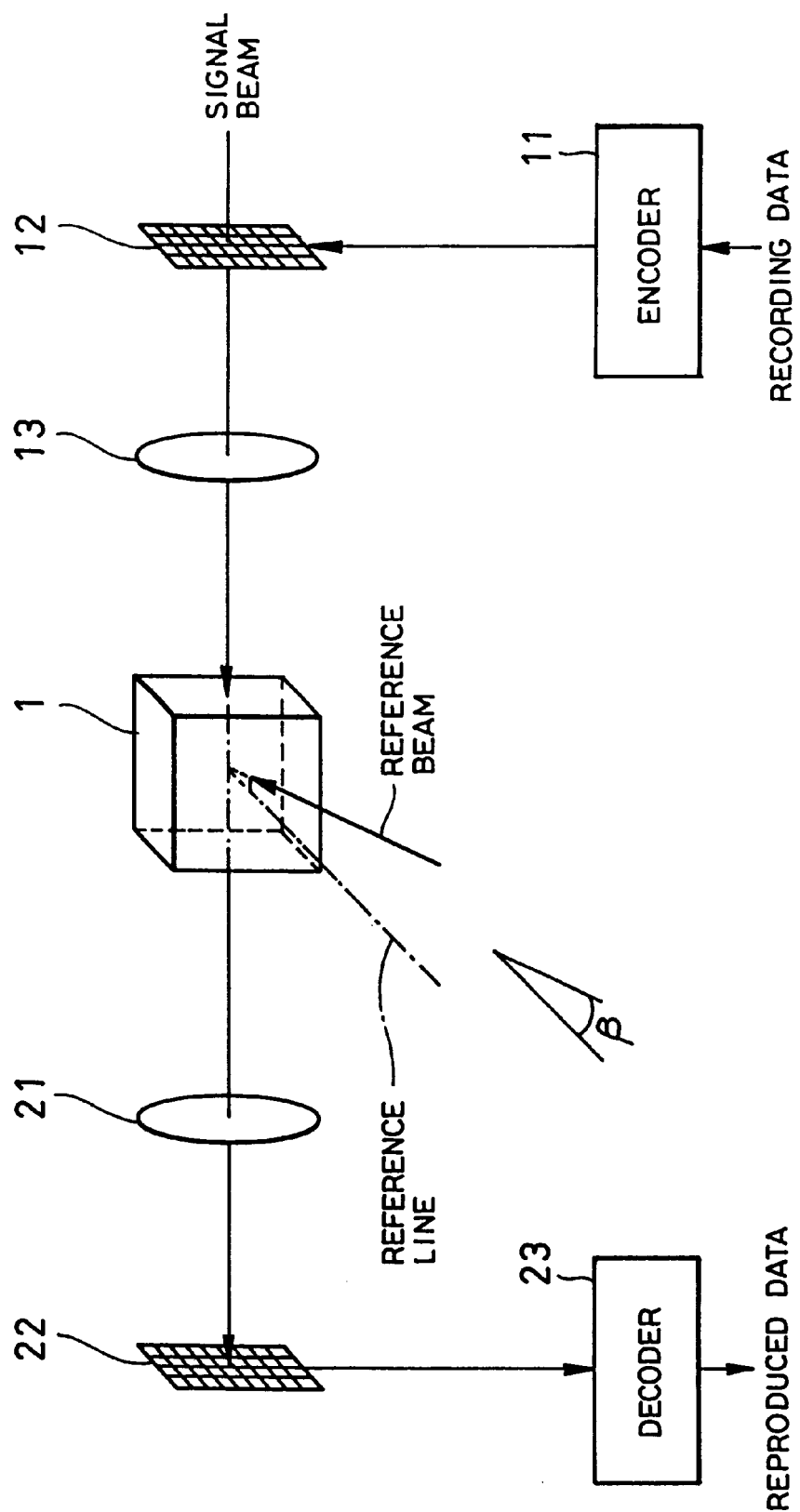
FIG. 1 is a block diagram illustrating the basic configuration of an information recording/reproducing system common to a prior art and respective embodiments of the present invention.
Figure 2:
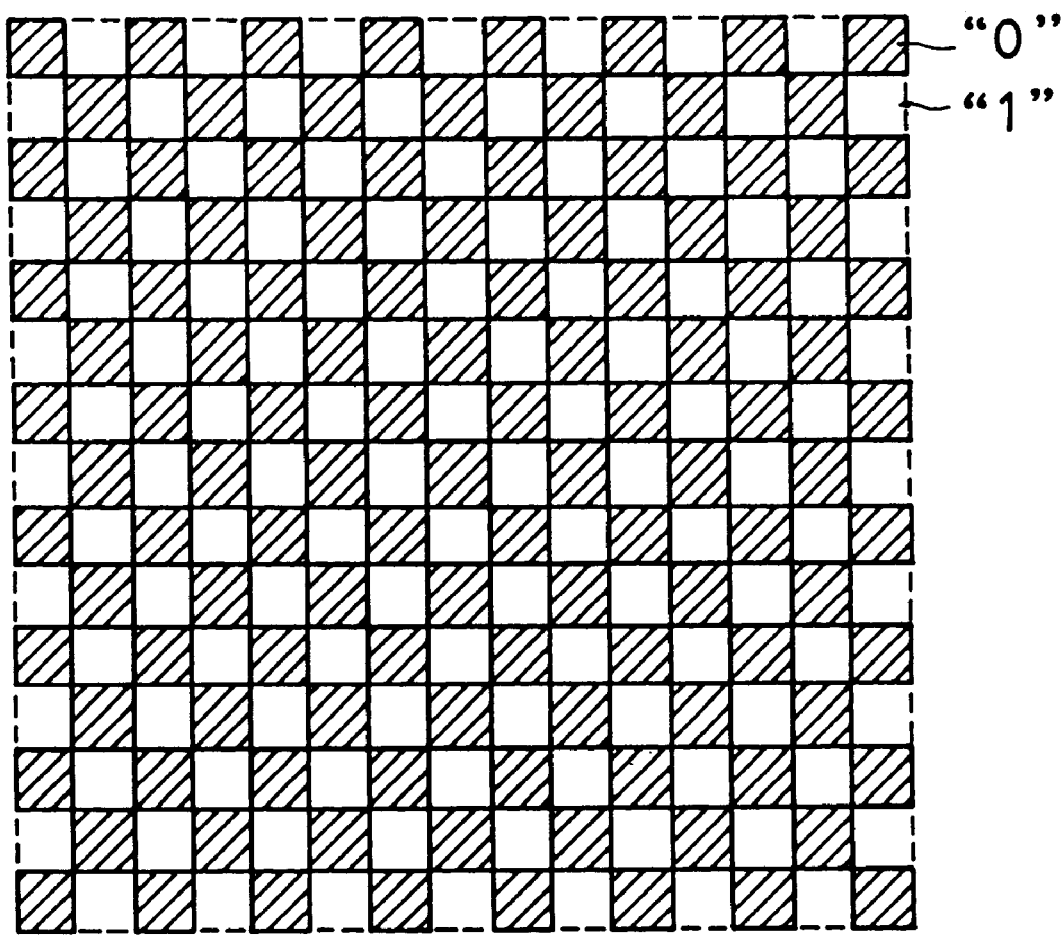
FIG. 2 is a schematic diagram illustrating an example of a data pattern image for a recording page.

A general configuration of an information recording/reproducing system according to first embodiment of the present invention is the same as that illustrated in FIG. 1.

However, the encoder 11 does perform processing unique to this embodiment. Specifically, data to be recorded, corresponding to a single unitary page or a predetermined number of unitary pages, is divided into two-dimensional or three-dimensional predetermined blocks such that at least one data bit "1" and at least one data bit "0" are included in each block. In other words, the data block includes a plurality of data bits which generally carry all digit levels to be read and determined upon reproduction. The unitary page data sequences to be recorded thus composed are sent to the SLM 12.

The data sent to the SLM 12 is recorded in the holographic memory medium 1 by a signal beam and a reference beam.

The data recorded in the holographic memory medium 1 is read by using the reference beam. In this event, diffracted light from the holographic memory medium 1 reaches the CCD 22 through the lens 21. The CCD 22 supplies its output indicative of the received light to the decoder 23 as a read signal.

Figure 10:
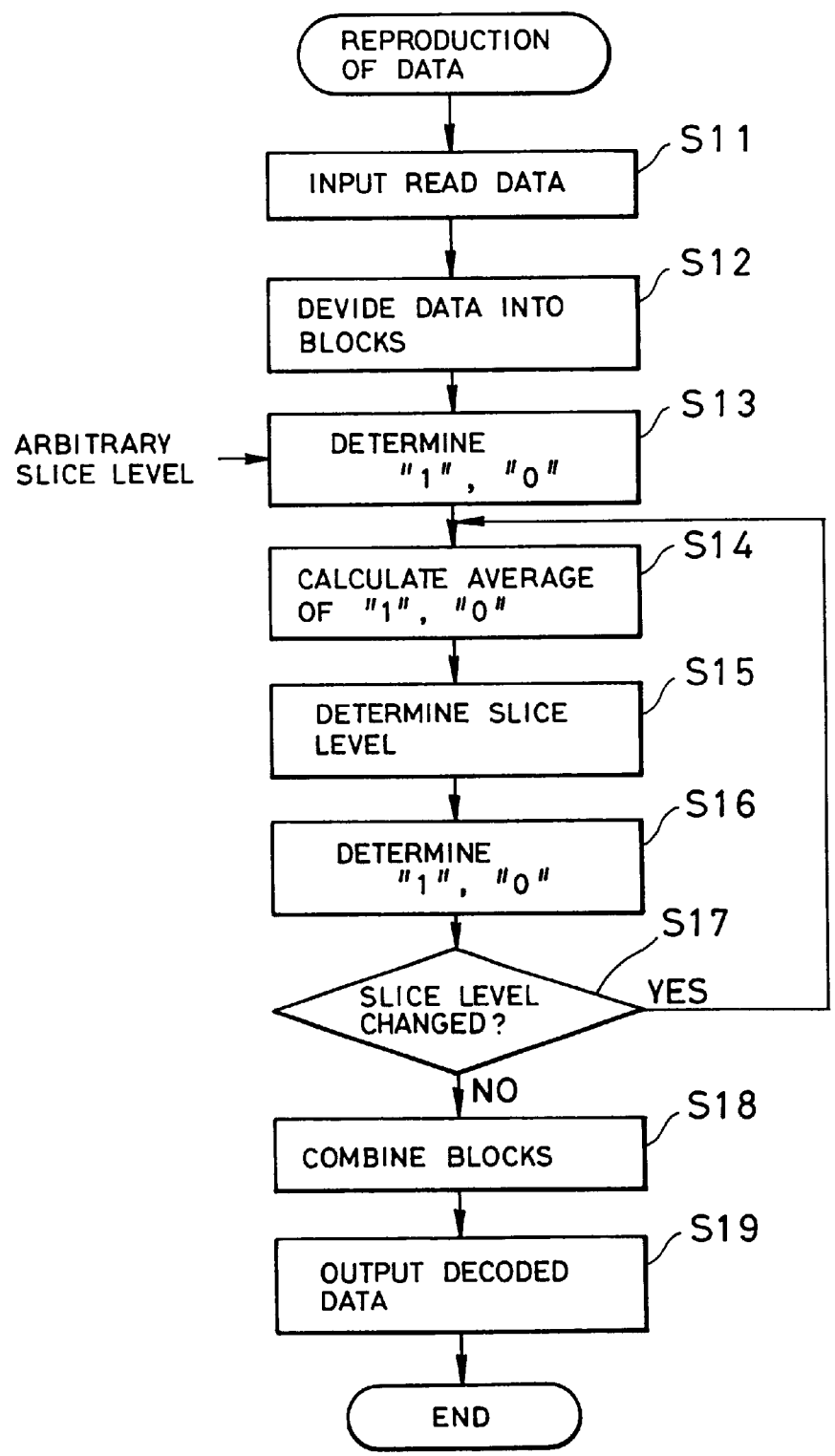
FIG. 10 is a flow chart illustrating a procedure for data reproduction processing performed in accordance with a first embodiment of the present invention.

The decoder 23 performs data reproduction processing unique to this embodiment. A flow chart of the processing is illustrated in FIG. 10.

Specifically, as the decoder 23, for example, A/D-converts the read signal to fetch digital signal data sequences (step S11), it divides each of the digital data sequences into predetermined blocks as a block recognition step (step S12).

Next, the decoder 23 compares each level of the read data (i.e., value of each bit) in each block with a preliminary slice level arbitrarily determined for the block (for example, an average value of all the read data in the block may be used as the slice level), and once determines "1" or "0" for the level of the read data by checking whether it is higher or lower than the slice level to produce a data carrying "1" or "0" (step S13).

Then, the decoder 23 calculates an average value of the read data corresponding to data determined as "1" (at least one) within the block produced by the processing at Step S13, and an average value of the read data corresponding to data determined as "0" (at least one) within the block produced by the processing at Step S13 (step S14).

The decoder 23 newly determines a slice level from the two average values so as to minimize a read error in the read data (step S15). Then, the decoder 23 compares the read data with the newly obtained slice level to determine "1" or "0" again for the level of the read data by checking whether it is higher or lower than the slice level, and newly produces determined data which carries "1" or "0" (step S16). As a new slice level determined at Step S15, an average of the two average values for "1" and "0" derived at Step S14 may be employed.

Subsequent to Step S16, the decoder 23 determines whether or not the slice level should be changed (step S17). If it should be changed, i.e., if it is determined that the read error in data can be further reduced, an average value of the read data corresponding to data determined as "1" and an average value of the read data corresponding to data determined as "0" are again calculated for each block of the determined data which have been finally derived to determine the slice level. Then, the procedure proceeds to Step S14 to determine "1" or "0" for the level of the read data.

If it is determined at Step S17 that the slice level need not be changed, the decoder 23 combines the blocks (step S18), and outputs the finally derived determined data as decoded data or reproduced data in time series (step S19).

The foregoing processing performed by the encoder 11 and the decoder 23 may be implemented by a personal computer or the like either in software or in hardware.

Figure 4:
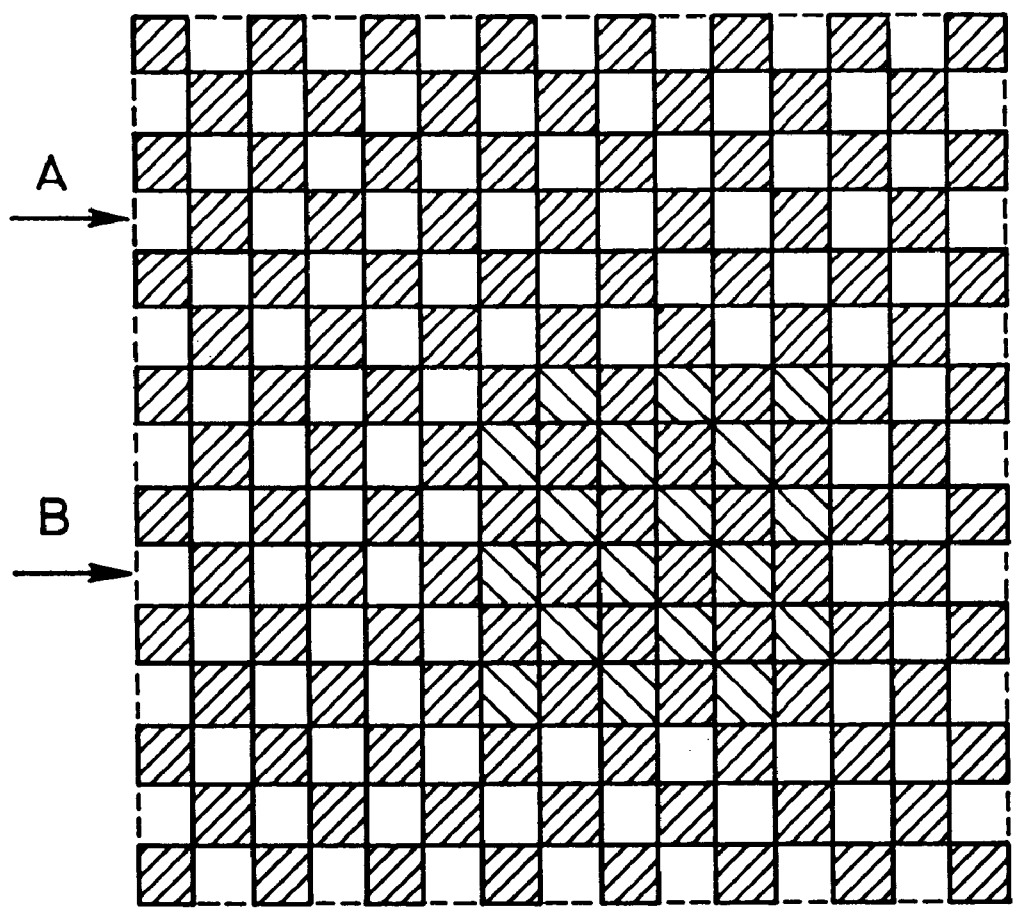
FIG. 4 is a schematic diagram illustrating an example of the irregular luminance pattern of FIG. 3 superimposed on the data pattern image of FIG. 2.
Figure 5:
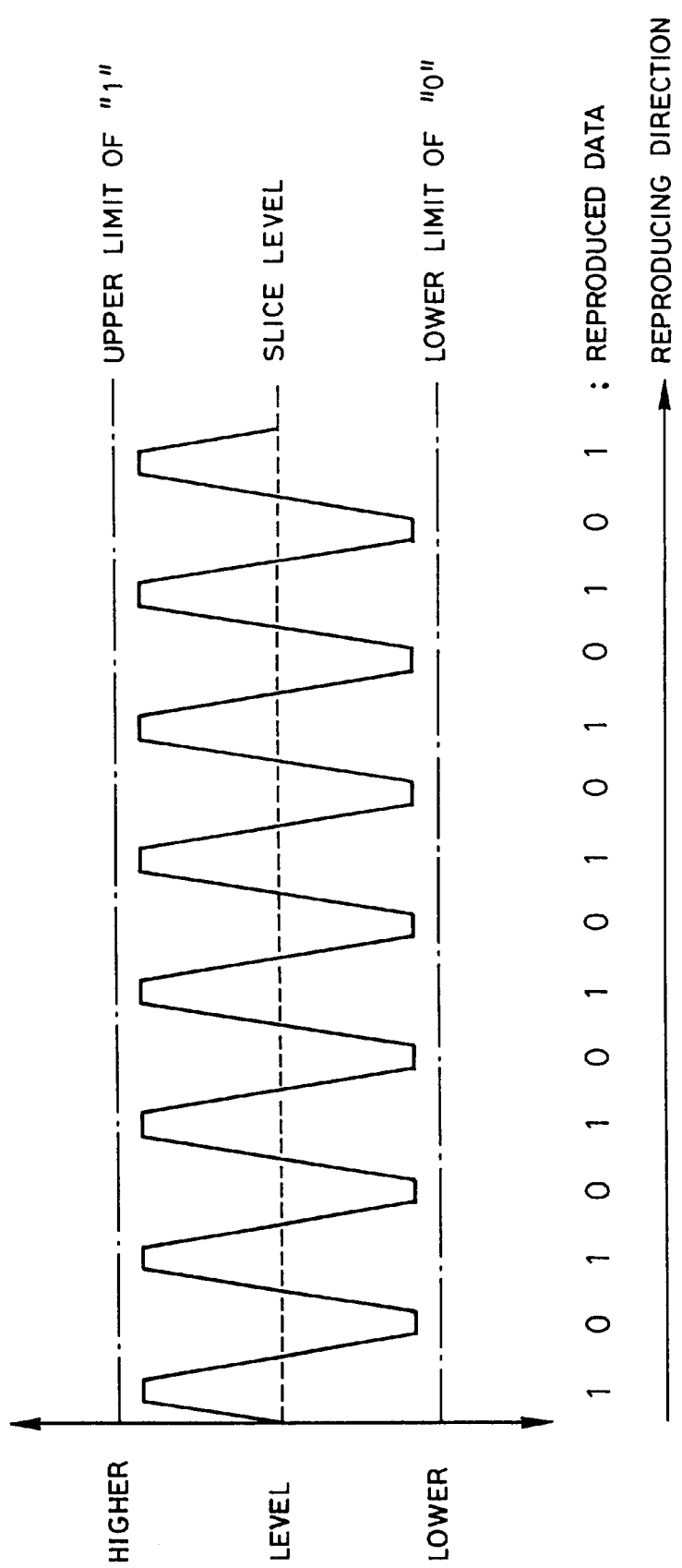
FIG. 5 is a time chart showing an example of level fluctuations of a read signal in a normal operation.
Figure 6:
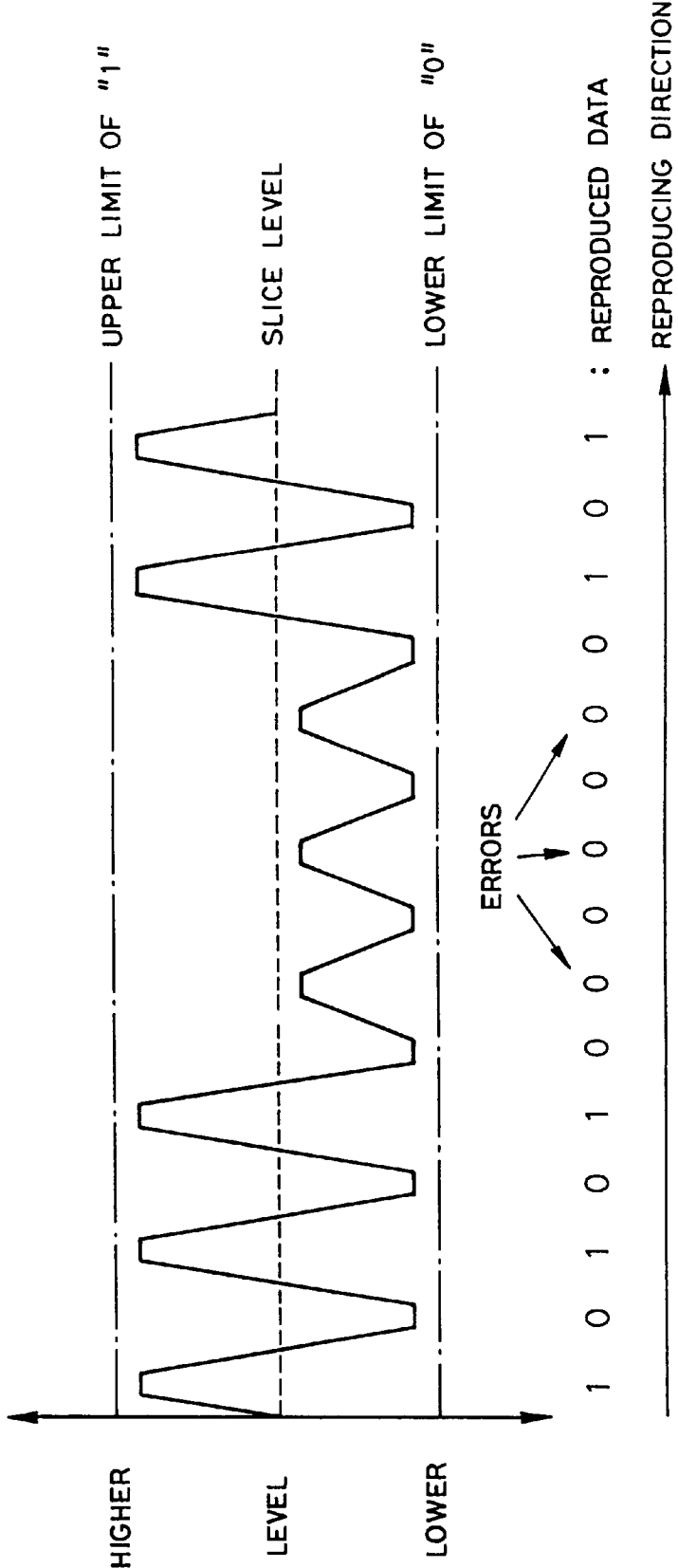
FIG. 6 is a time chart showing an example of level fluctuations of a read signal when an irregular luminance is present.
Figure 7:
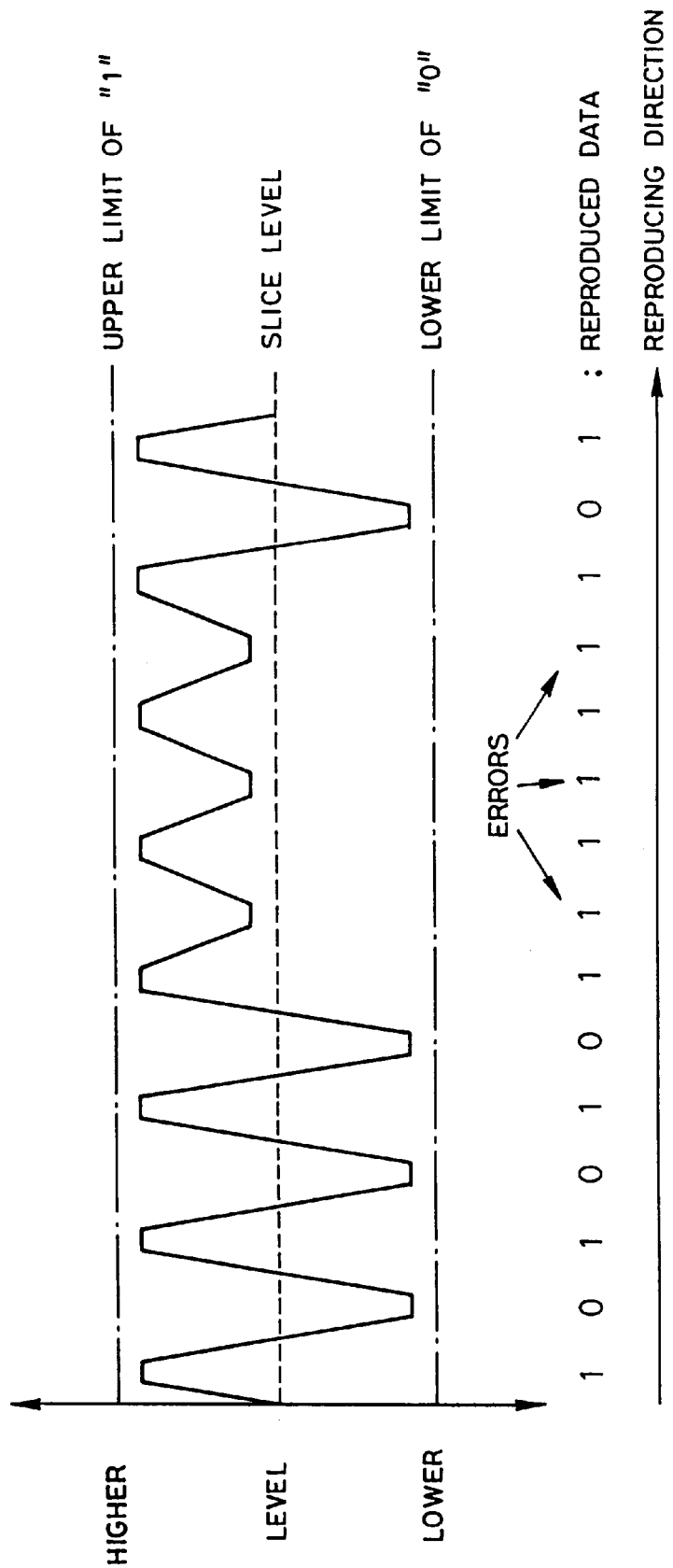
FIG. 7 is a time chart showing another example of level fluctuations of a read signal when an irregular luminance is present.
Figure 11:
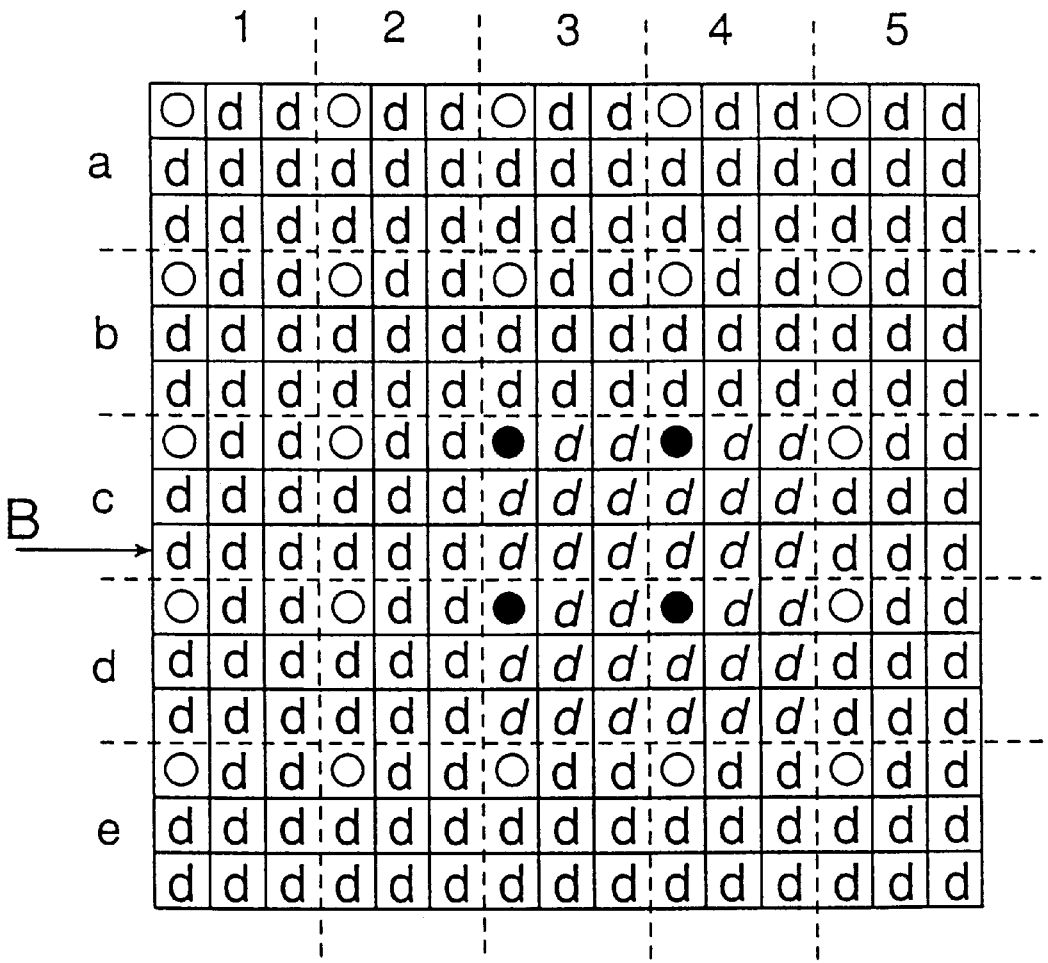
FIG. 11 is a diagram illustrating an example of a data pattern for a unitary recording page for explaining in detail the data reproduction processing of FIG. 10.

As an example of two-dimensional division of recording data into blocks, explanation will be given of a two-dimensional data matrix of FIG. 4 which is divided into 3 bits by 3 bits blocks 1-$a$, 2-$a$, ..., 5-$e$ as illustrated in FIG. 11.

A block is composed to satisfy a condition that it must include one or more data bits "1" and one or more data bits "0." Here, one bit located at the upper left corner of the data in the 3×3 block is used as an adjusting bit for satisfying the condition, so that the remaining eight bits, excluding the upper left one bit, are used as normal information data. As a specific method of determining the value for the adjusting bit, the smaller one of the numbers of "1" and "0" of information data in the block is assigned to the adjusting bit. If the number of "1" is the same as the number of "0" in information data of a block, either of them, for example, "1" may be selected.

In this way, it is possible to compose a block which includes both data "1" and "0" without fail.

According to this embodiment, when the blocked data as illustrated in FIG. 11 is read, the read data is divided into 3×3 blocks identical to those upon encoding at Step S12. Then, at Step S13, each bit of the read data is determined whether it is "1" or "0" with an arbitrary slice level for each block, and an average value of the read data corresponding to "1" data thus determined and an average value of the read data corresponding to "0" data thus determined are again averaged to determine a slice level at Steps S14 and S15. Then, each bit of the read data is again determined whether it is "1" or "0" with the newly determined slice level.

Therefore, neighboring data on a recording format, here, in a unitary plane page of data to be read, i.e., data "1" and "0" within a previously defined block are used to set a slice level to determine "1" or "0" of the data. Therefore, even if the level of read signal fluctuates due to noise caused by a variety of factors, the values of data within the block, which is referenced for the slice level, also fluctuates to cause the slice level to fluctuate in a manner similar to the data, thereby making it possible to correctly determine whether the read data is "1" or "0."

Figure 12:
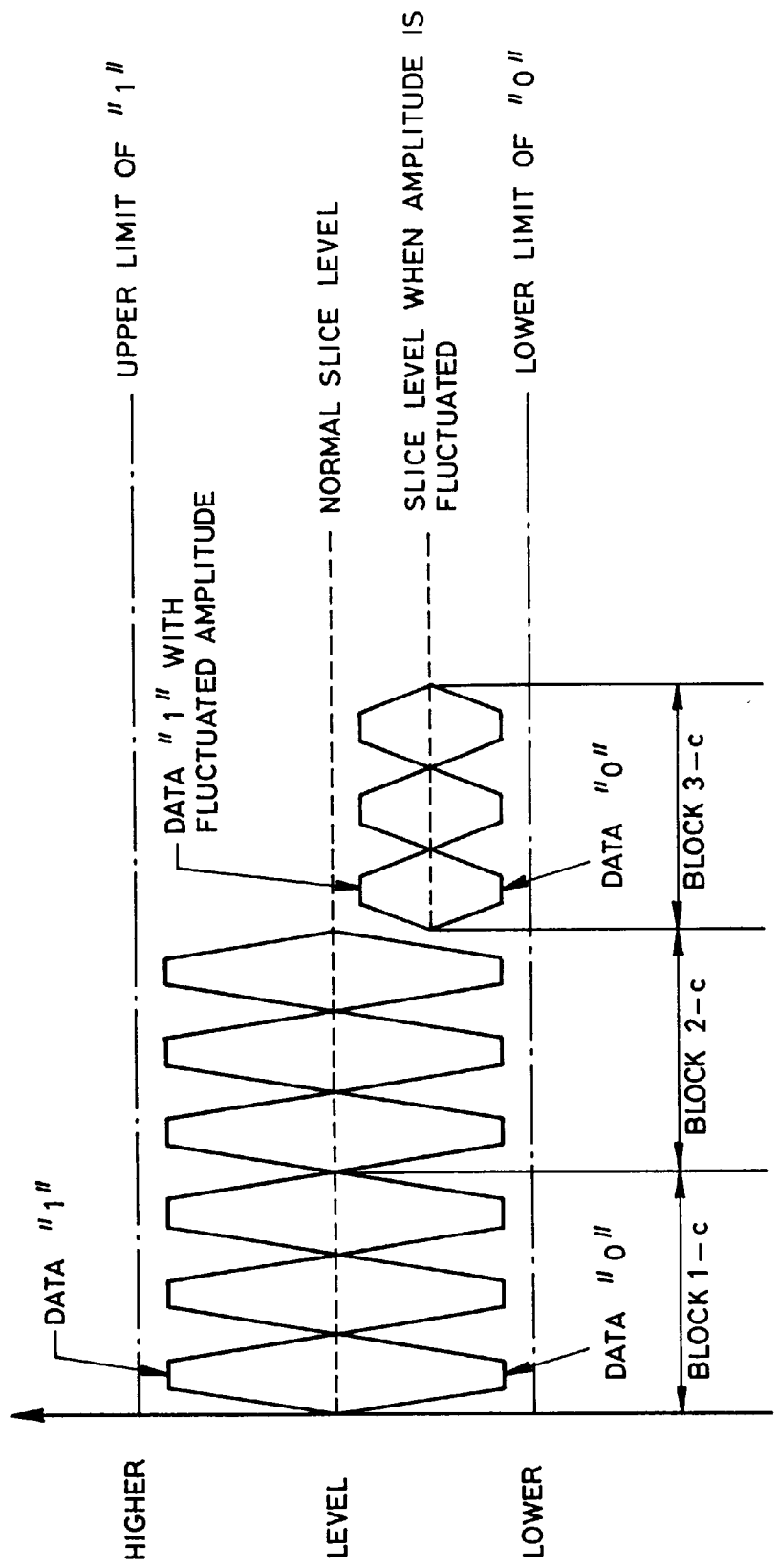
FIG. 12 is a time chart for explaining data reproduced by the data reproduction processing of FIG. 10.

FIG. 12 shows level fluctuations of the data corresponding to a portion of the read data, indicated by an arrow B in FIG. 11, which has been sliced in the horizontal direction.

Referring specifically to FIG. 12, in blocks free from the influence of irregular luminance such as blocks 1-c, 2-c or the like, data can be correctly determined whether it is "1" or "0" based on a slice level determined by the average values for the read data "1" and for the read data "0" without errors.

In blocks influenced by irregular luminance such as a block 3-c, on the other hand, the read data "1" in the block is influenced by the irregular luminance. The read data "1" and the read data "0" are determined with a new threshold value changed as appropriate, and the slice level determined in accordance with these read data also follow the change, so that the read data having levels fluctuating due to a noise component such as irregular luminance can also be determined for "1" or "0" without errors.

Next, a three-dimensional division of recording data into blocks will be explained with reference to an example. In this example, the two-dimensional data matrix of FIG. 4 is processed such that not only a plane A as a unitary recording page is divided into 3 bits by 3 bits areas 1-a, 2-a, ..., 5-e, but also a plane B as a unitary recording page produced by changing an incident angle β of a reference beam over a time T is also divided corresponding to each of divided areas of the plane A, as shown in FIG. 13, to produce a block having a thickness of the time T and a volume of 2 bits of plane dimension by 3 bits of vertical dimension by 3 bits of horizontal dimension.

In such a division of recording data into blocks, it can be generally said that a data block is formed by the number of bits corresponding to a vertical length by which a recording plane on the medium 1 is divided; the number of bits corresponding to a horizontal length by which the recording plane is divided; and the number of bits corresponding to a recording time interval for a recording area defined by both of the numbers of bits.

Figure 13:
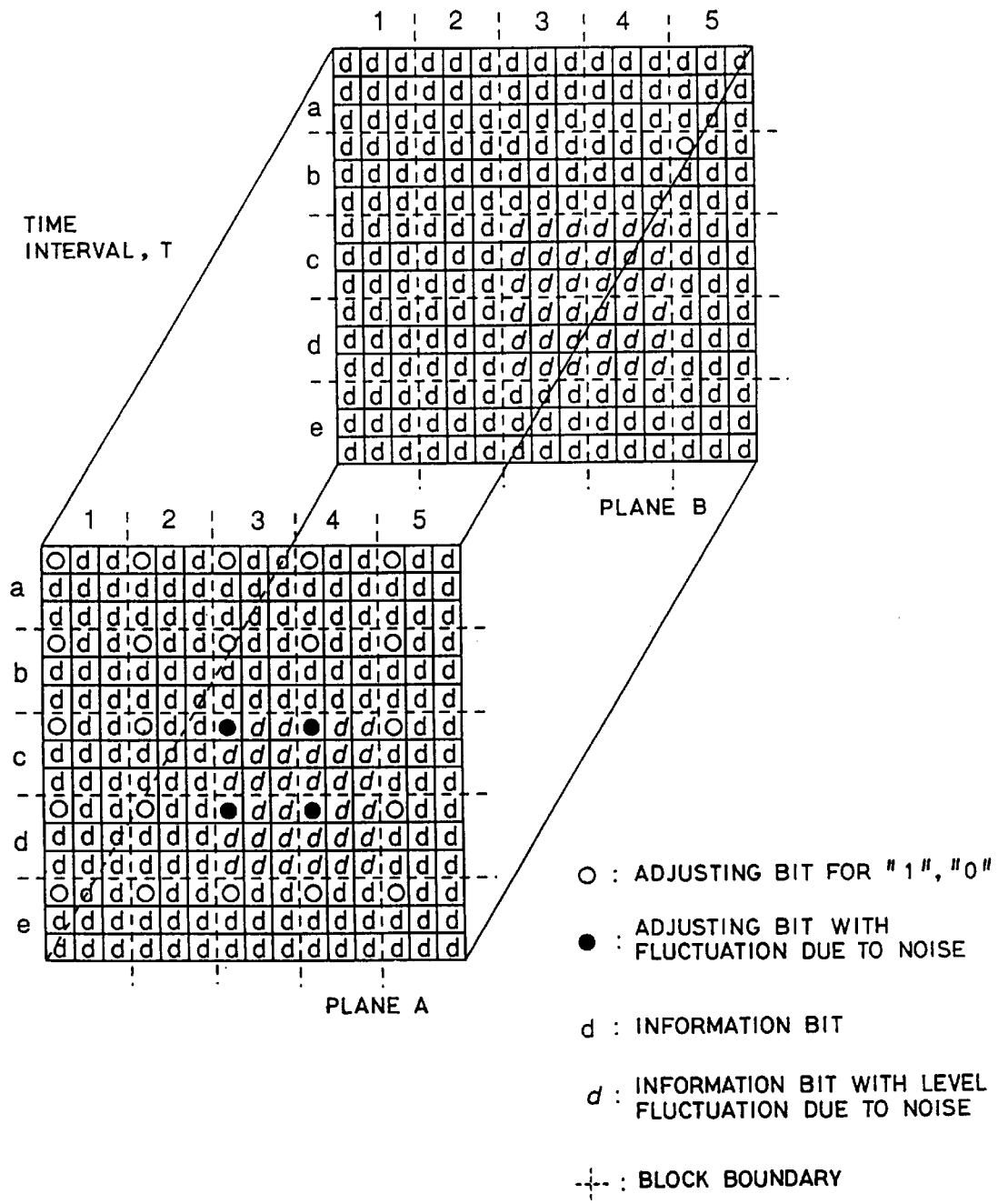
FIG. 13 is a diagram illustrating another example of a data pattern for a unitary recording page for explaining in detail the data reproduction processing of FIG. 10.

More specifically, in FIG. 13, the encoding is performed, for example, on a virtually three-dimensional cubic block of 2 bits by 3 bits by 3 bits formed by an area 1-a on a plane A and an area 1-a on a plane B, both of which are recording pages. The cubic block is the unit of the encoding.

A block is composed to satisfy a condition that it must include one or more data bits "1" and one or more data bits "0." Here, one bit at the upper left corner of data in a 3×3 area on the plane A is chosen to be an adjustment bit, and a total of 17 bits including eight bits in this area excluding the upper left bit and all nine bits of data in the 3×3 area on the plane B are used as information data. For the adjusting bit, the smaller one of the numbers of "1" and "0" of information data in the block is assigned. If the number of "1" is the same as the number of "0" in information data of a block, either of them, for example, "1" may be selected.

According to the embodiment, when blocked data as illustrated in FIG. 13 is read, the read data is divided into 2×3×3 blocks identical to those upon encoding at Step S12, and determination is made as to whether the read data is "1" or "0" based on an arbitrary slice level for each block at Step S13. An average value of the read data corresponding to data determined as "1" and an average value of the read data corresponding to data determined as "0" are further averaged at Step S14 to determine the slice level at Step S15. Then, the read data is again determined whether it is "1" or "0" based on the newly determined slice level.

Thus, the "1"/"0" determination is performed by using neighboring data on a three-dimensional recording format of data to be read, i.e., other data within a three-dimensional block over a previously set time interval T to determine a slice level. Therefore, even if the level of read signal fluctuates due to noise caused by a variety of factors, the values of data within the block, which is referenced for the slice level, also fluctuates to cause the slice level to fluctuate in a manner similar to the data, thereby making it possible to correctly determine whether the read data is "1" or "0." The approach for setting a slice level using three-dimensional blocks as mentioned is advantageously resistant to fluctuations in a recording form and a reproduction form on the time base, and capable of performing efficient processing because of a large amount of data contained in each block.

As described above, even if the level of the read data arranged in two-dimensional or three-dimensional recording format spatially or temporally fluctuates due to a variety of factors, the slice level for determining "1" or "0" is determined from the read data "1" and "0" which are similarly affected by the fluctuations, thereby making it possible to determine whether each bit of the read data is "1" or "0" even if level fluctuations due to noise is present in the read data.

Figure 8:
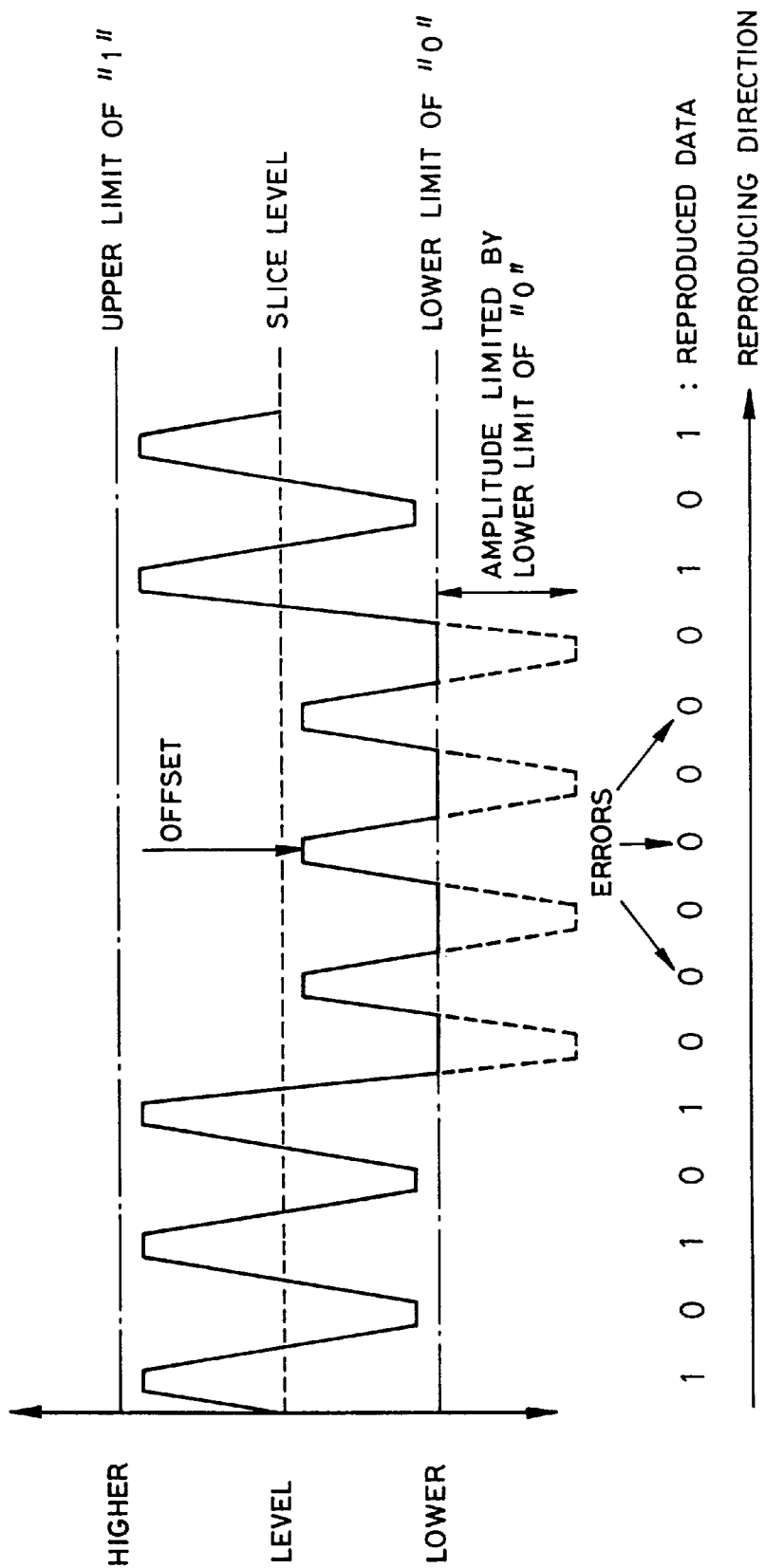
FIG. 8 is a time chart showing an example of level fluctuations of a read signal when an offset component is included in the read signal.
Figure 9:
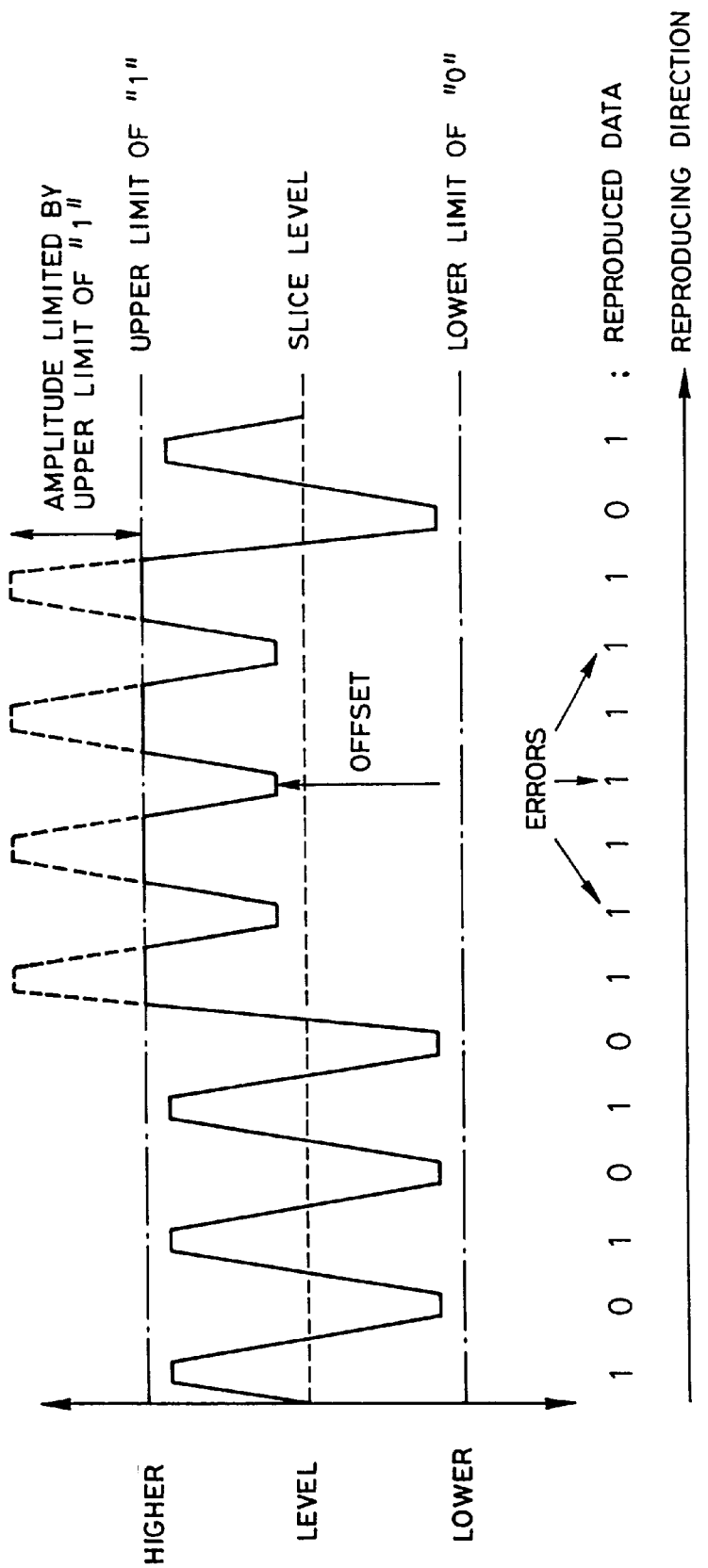
FIG. 9 is a time chart showing another example of level fluctuations of a read signal when an offset component is included in the read signal.

Moreover, fluctuations exceeding an upper limit of "1" and falling below a lower limit of "0," as illustrated in FIGS. 8 and 9 may cause the level of a read signal to saturate, resulting in the lack of linearity in the level change and a significantly distorted waveform of the read signal. Even in such a case, the slice level is determined utilizing information of both the read data "1" and "0," the slice level can be appropriately determined because even if one is saturated, the other remains unsaturated.

While the foregoing explanation has been made referring to an example where the shape of block for determining the slice level is 3×3 for a two-dimensional block, and 2×3×3 for a three-dimensional block, any shape of block may be used as long as it includes both of data "1" and "0." Alternatively, a variety of blocks may be combined without limiting the shape. Further, a block having a different shape may be provided for determining the slice level for extracting data "1" and "0" separately from the block for determining "1" or "0" for data.

Also, while an adaptive slice level is calculated after each bit of data in block is determined whether it is "1" or "0" based on an arbitrary slice level for each block, the slice level may be calculated by first determining the read data as to whether data is "1" or "0" based on a single slice level before it is divided into blocks, and then dividing the read data into blocks.

An information recording/reproducing system according to another embodiment of the present invention can be basically realized in a similar manner to that illustrated in FIG. 1.

The encoder 11, however, does perform processing unique to this embodiment. More specifically, recording data corresponding to a unitary page or a predetermined number of unitary pages is divided into predetermined two-dimensional or three-dimensional blocks, each of which is composed to include at least one reference data "1" specified at an assigned location, and at least one reference data "0" similarly specified at an assigned location. In other words, the reference data bits, each carrying at least first and second digit levels ("0" and "1" in this embodiment) to be read and determined upon reproduction, are arranged at the respective predetermined locations in a resulting data block. A unitary page recording data sequence thus composed is sent to the SLM 12.

The data sent to the SLM 12 is recorded in the holographic memory medium 1 by a signal beam and a reference beam.

The data recorded in the holographic memory medium 1 is read by using the reference beam. In this event, diffracted light from the holographic memory medium 1 reaches the CCD 22 through the lens 21. The CCD 22 supplies its output indicative of received light to the decoder 23 as a read signal.

Figure 14:
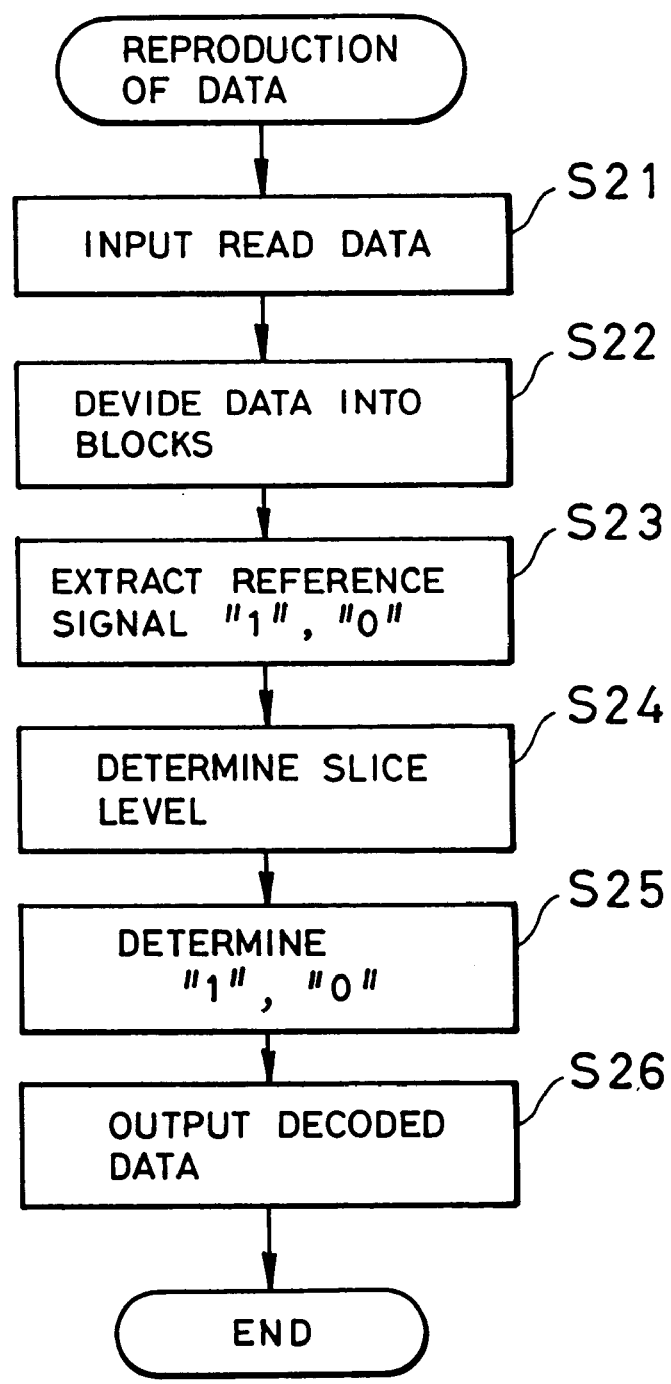
FIG. 14 is a flow chart illustrating a procedure for the data reproduction processing performed in accordance with a second embodiment of the present invention.

The decoder 23 performs data reproduction processing unique to this embodiment as illustrated in FIG. 14.

Specifically, as the decoder 23, for example A/D-converts a read signal to fetch digital signal data sequences (step S21), it divides each of the digital data sequences into predetermined blocks as a block recognition step (step S22).

Next, the decoder 23 extracts reference data "1" and "0" within the block (step S23), and determines a slice level so as to minimize read errors in the read data from both reference data (step S24). As the slice level, an average value of the reference data "1" and "0" may be employed.

After the slice level has been determined, the decoder 23 determines "1" or "0" for the level of the read data by checking whether it is higher or lower than the slice level (step S25). The data "1" and "0" obtained by the determination are output as decoded data, i.e., reproduced data in time series (step S26).

The processing performed by the encoder 11 and the decoder 23 may also be implemented by a personal computer or the like either in software or in hardware.

As an example of two-dimensional division of recording data into blocks, explanation will be given of a two-dimensional data matrix of FIG. 4 which is divided into 3 bits by 3 bits blocks 1-a, 2-a, . . . , 5-e as illustrated in FIG. 15.

A block is composed to satisfy a condition that it must include one or more reference data bits "1" and one or more reference data bits "0" respectively specified at particular locations in the block. Here, one bit located at the upper left corner of the data in each 3×3 block is used as the reference data bit "1" and the next one bit to the right as the reference data bit "0," and the remaining portion except for the two locations is assigned for normal information data.

According to the embodiment, when the blocked data as illustrated in FIG. 15 is read, the read data is divided into 3×3 blocks identical to those upon encoding at Step S22. At Step S23, the reference data "1" recorded at the upper left corner and the reference data "0" recorded at the next location to the right of the reference data "0" are extracted in each block at Step S23. Then, at Step S24, the slice level is determined by the extracted reference data, and each bit of the read data is determined whether it is "1" or "0" based on the determined slice level.

Therefore, neighboring data on a recording format of data to be read, i.e., the reference data positioned at previously specified locations in a block are used to set a slice level to determine "1" or "0" of the data. Therefore, even if the level of read signal fluctuates due to noise caused by a variety of factors, the values of the reference data within the block, which is referenced for the slice level, also fluctuates to cause the slice level to fluctuate in a manner similar to the reference data, thereby making it possible to correctly determine whether the read data is "1" or "0."

Figure 16:
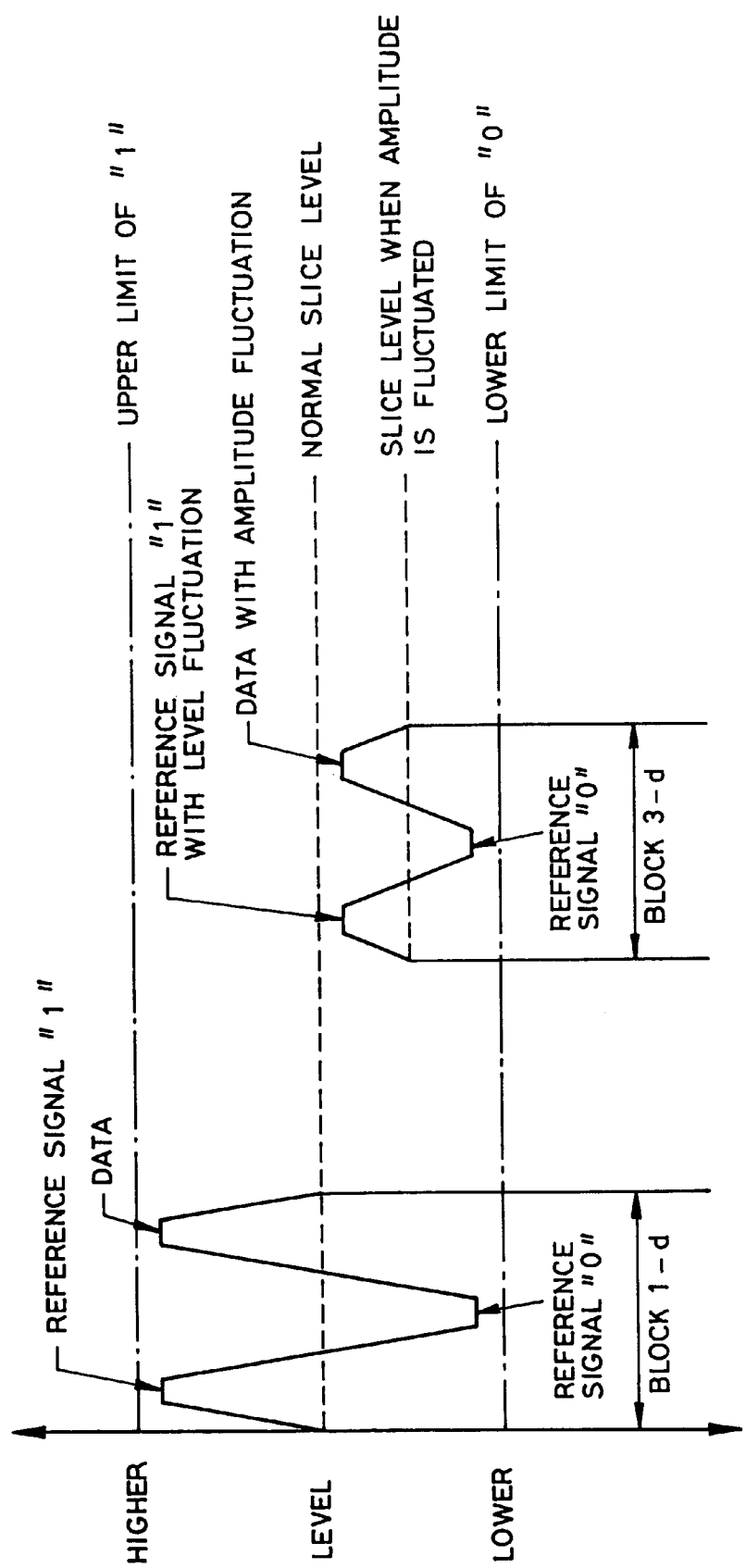
FIG. 16 is a time chart for explaining data reproduced by the data reproduction processing of FIG. 14.

FIG. 16 shows level fluctuations of the read data corresponding to a portion of the read data, indicated by an arrow B in FIG. 15, which has been sliced in the horizontal direction.

Referring specifically to FIG. 16, in blocks free from the influence of irregular luminance such as a block 1-d or the like, data can be correctly determined that it is "1" or "0" based on a slice level determined by the reference data "1" and the reference data "0" without errors.

In blocks influenced by irregular luminance such as a block 3-d, on the other hand, the reference data "1" in the block is influenced by the irregular luminance in a manner similar to other data. Thus, the reference data "1" and the reference data "0" are determined with a new threshold value changed as appropriate, and the slice level determined in accordance with these read data also follow the change, so that the read data having level fluctuations can also be determined for "1" or "0" without errors.

Next, a three-dimensional division of recording data into blocks will be explained with reference to an example. In this example, the two-dimensional data matrix of FIG. 4 is processed such that planes A and B, which are recording pages, are both divided into 3 bits ×3 bits areas 1-a, 2-a, . . . , 5-e, and an interval between both planes is defined by changing an incident angle β of a reference beam over a time T, as shown in FIG. 17, i.e., a block having two planes spaced by the time T and a volume of 2 bits of plane dimension by 3 bits of vertical dimension by 3 bits of horizontal dimension.

Figure 17:
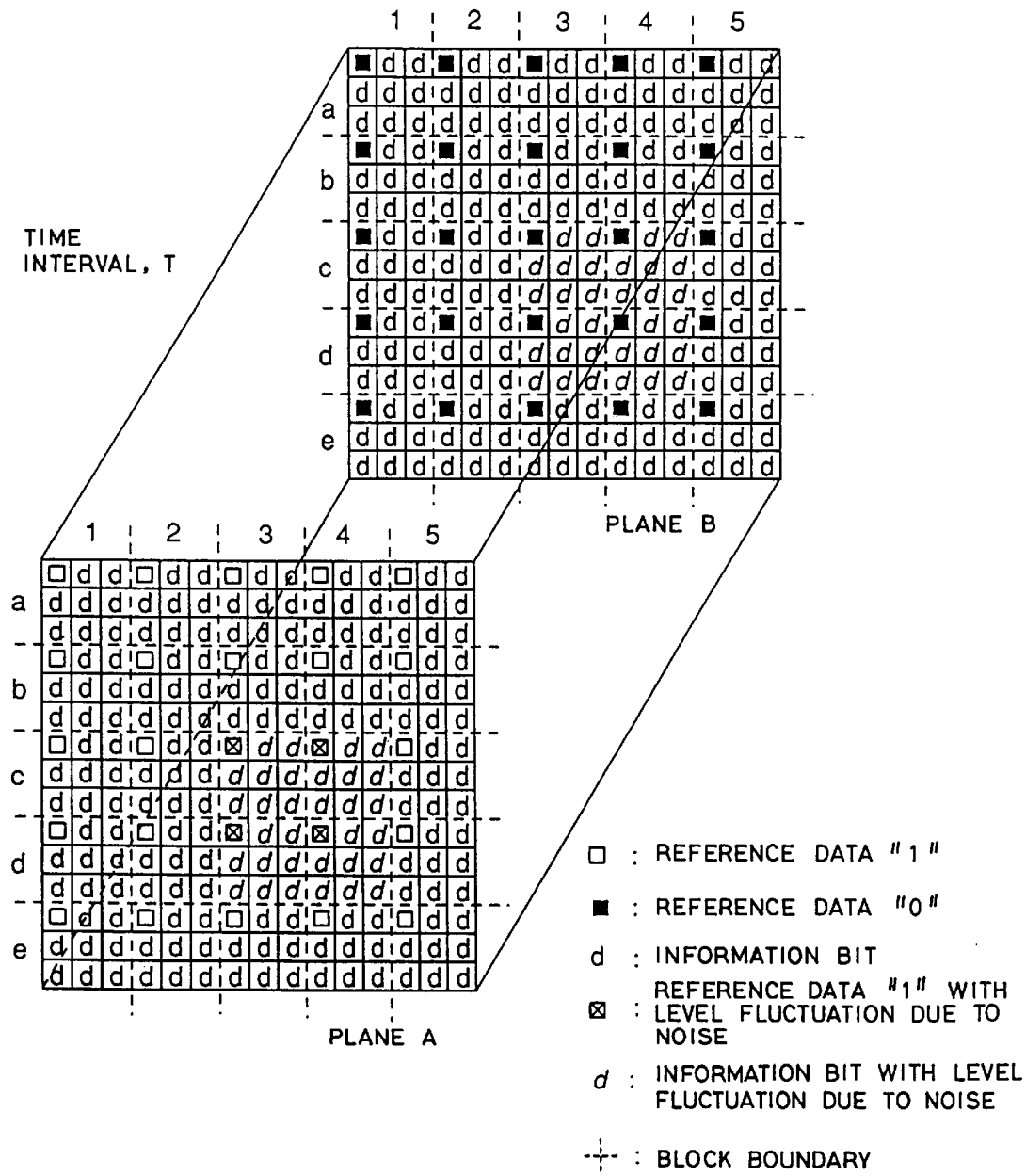
FIG. 17 is a diagram illustrating another example of a data pattern for a unitary recording page for explaining in detail the data reproduction processing of FIG. 14.

More specifically, in FIG. 17, encoding is performed, for example in units of a three-dimensional cubic block of 2 bits by 3 bits by 3 bits formed by an area 1-a on the plane A and an area 1-a on the plane B, both of which are recording pages.

A block is composed to satisfy a condition that it must include one or more reference data bits "1" and one or more reference data bits "0" respectively specified at particular locations in the block. Here, one bit at the upper left corner of data in a 3×3 area on the plane A is used as the reference data "1," and one bit at the upper left corner of data in a corresponding 3×3 area on the plane B is used as the reference data "0." The remaining 16 bit locations are assigned for information bit data.

According to the embodiment, when the blocked data as illustrated in FIG. 17 is read, the read data is divided into 2×3×3 blocks identical to those upon encoding at Step S22. At Steps S23, the reference data "1" recorded at the upper left corner on the plane A and the reference data "0" recorded at the upper left corner on the plane B are extracted in each block. Then, at Step S24, the slice level is determined from the extracted reference data with which each bit of the read data is determined as to whether it is "1" or "0."

Thus, the "1"/"0" determination is performed by using neighboring data on a three-dimensional format of data to be read, i.e., the reference data within a three-dimensional block over a previously set time interval T to set a slice level. Therefore, even if the level of read signal fluctuates due to noise caused by a variety of factors, the values of data within the block, which are referenced for the slice level, also fluctuate to cause the slice level to fluctuate in a manner similar to the data, thereby making it possible to correctly determine whether the read data is "1" or "0." The approach for setting a slice level using three-dimensional blocks as mentioned is advantageously capable of correcting fluctuations in a recording form and a reproduction form on the time base, and capable of processing a large amount of data in blocks.

As described above, even if the amplitude of two-dimensionally or three-dimensionally arranged data spatially or temporally fluctuates due to a variety of factors, the reference signals "1" and "0," which are simultaneously affected by the fluctuations are located in the vicinity of other data within the blocks, thereby making it possible to determine correctly whether data is "1" or "0" from the reference signals "1" and "0."

The embodiment also provides a proper slice level and "1"/"0" determination in cases shown in FIGS. 8 and 9, in a manner similar to the first embodiment.

While the foregoing explanation has been made referring to an example where the shape of block for determining the slice level is 3×3 for a two-dimensional block, and 2×3×3 for a three-dimensional block, any shape of block may be used as long as it includes the reference data "1" and "0" which are specified at determined locations (strictly, the locations of which are recognizable upon decoding). Alternatively, a variety of blocks may be combined without limiting the shape. Further, a block having a different shape may be provided for extracting the reference data "1" and "0" separately from the block for determining whether the data is "1" or "0."

Also, the block may include a plurality of reference data "1" and "0," respectively. Further, the reference data "1" and "0" may be placed at different locations from block to block.

Furthermore, while the foregoing embodiment uses binary data consisting of "1" and "0" as data to be recorded and reproduced, multi-value data having three values or more may also be recorded and reproduced. In this case, a plurality of slice levels may be calculated from the reference data "1" and "0" to determine the multi-value data. Alternatively, other reference data indicative of any intermediate value may be recorded other than the reference data "1" and "0" to determine the multi-value data.

While the respective embodiments described above cope with irregular luminance in unitary recording page for each block, a third embodiment described below provides a method which can cope with irregular luminance in a unitary recording page without the need for dividing the unitary recording page into blocks.

In the following, explanation is given of multiplex recording which records a modulated signal beam at the same location in the holographic memory medium 1 for each page by changing the incident angle β of the reference beam in predetermined steps. In this case, separate from normal recording pages for carrying normal information data patterns, a data pattern serving as the basis of correcting for irregular luminance is recorded as a reference page. Upon reading data, the reference page is read to detect irregular luminance in the reference page based on a known pattern, and the value of information data in a recording page is corrected in accordance with the detection result.

FIG. 18 shows a relationship between a normal recording page and the reference page.

It can be seen from FIG. 18 that the first reference page is assigned to the first page, and subsequently a reference page is assigned to every ten normal recording pages. The reference page on Page 1 functions to correct the values of information data on recording pages on Pages 2 to 5; a reference page on Page 11 functions to correct the values of information data on recording pages on pages 6 to 15; and so on. A reference page on the {10(n−1)+1}the page functions to correct the values of information data on normal recording pages on Pages (10n−4) to (10n+5).

The reference page on Page 1 is an initial reference page which belongs to a different category from the other reference pages. This page has the responsibility of identifying this page as the first recording page in the holographic memory medium 1.

Each of the reference pages is coded in the same manner as data patterns recorded on a normal recording page, and recorded therein is a random pattern having a known bit position relationship.

The encoder 11 inserts the reference page for correcting irregular luminance as mentioned into normal recording pages to compose a data sequence to be recorded.

Figure 19:
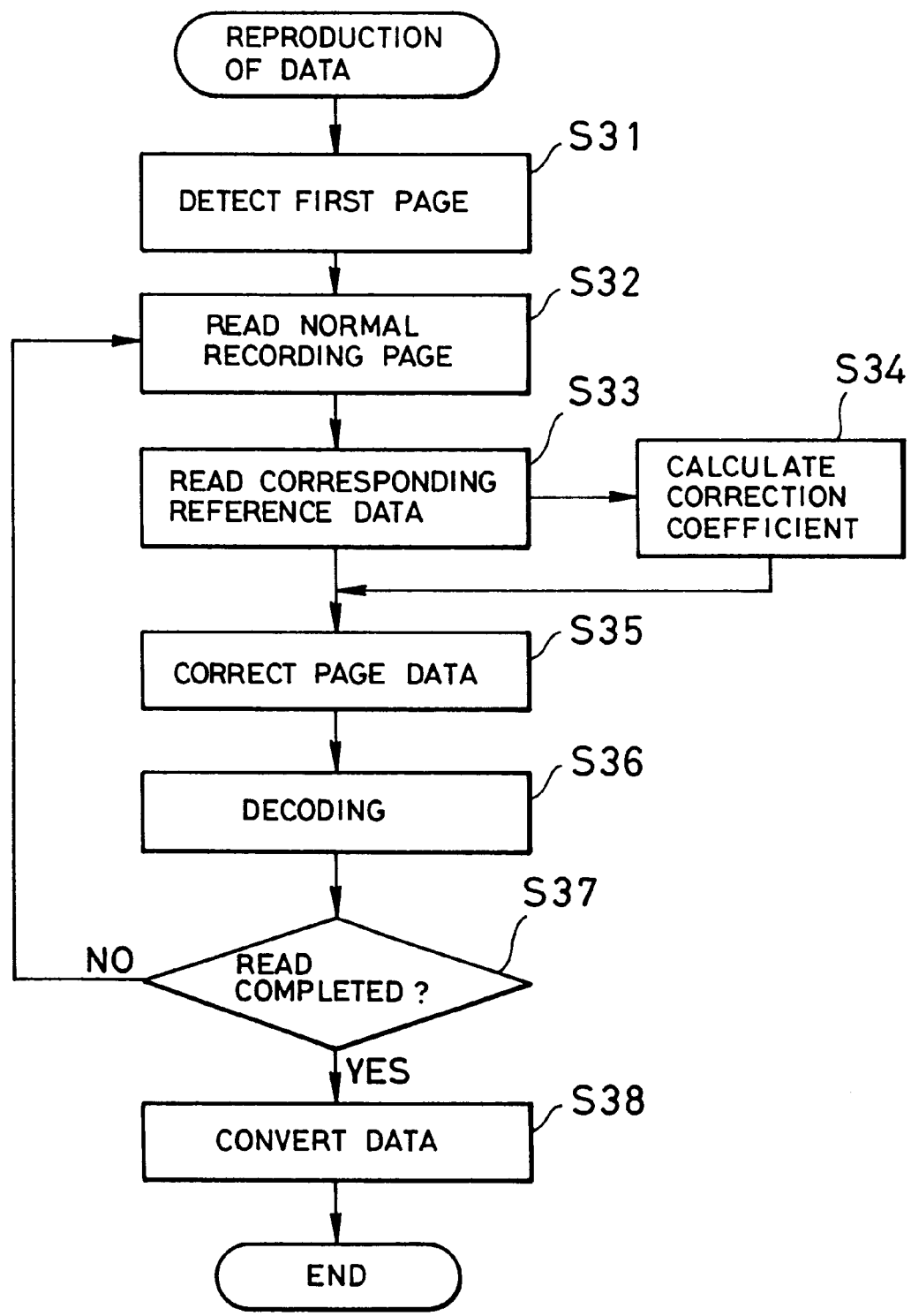
FIG. 19 is a flow chart illustrating a procedure for data reproduction processing performed in accordance with the third embodiment of the present invention.

Each of the pages recorded in the holographic memory medium 1 is read therefrom by sequentially changing the incident angle β of the reference beam, and a read signal is supplied to the decoder 23. In this event, the decoder 23 corrects irregular luminance based on the read reference page. FIG. 19 is a flow chart illustrating a data reproducing procedure including such correction.

Referring to FIG. 19, the decoder 23, upon detecting the initial reference page by identifying it (step S31), reads a normal page (step S32), and then reads data on a corresponding reference page (step S33).

When reading data on the reference page, the decoder 23 calculates a correction coefficient (step S34), and corrects data on the normal recording page using the correction coefficient (step S35). If no data on the reference page is read, the decoder 23 corrects data on the normal recording page using a previously calculated correction coefficient corresponding thereto (step S35).

The data correction as mentioned is followed by the data reproduction processing explained in the respective embodiments in connection with FIG. 10 or 11 (step S36). In this way, a correct slice level is set after data on the entire page have been corrected, with the result that a digital signal is reliably reproduced.

After Step S36, it is determined whether or not necessary pages have been read (step S37). If not, the procedure returns to Step S32 to continue to read other pages.

If necessary pages have been read, the decoder 32 performs decoding including the processing for releasing the paged configuration (step S38), followed by the termination of the processing illustrated in the flow chart.

Next, the data correcting method conducted at Steps S34 and S35 will be described in detail.

A data pattern on a reference page have their black portions and white portions arranged at bit positions which have previously been recognized on the decoder side. Therefore, the decoder 23 can recognize whether each of bits arranged in a two-dimensional matrix carries black or white, in other words, which of the digit levels is assigned to.

In a white portion, the value of the read data corresponding to the white portion itself corresponds to the amount of irregular luminance. In other words, this is comparable to detection of a deviation from an expected value with respect to the value of a read signal corresponding to data bit which has been identified as "1."

In a black portion, on the other hand, the amount of irregular luminance therein is estimated from irregular luminance of a while portion adjacent to or surrounding the black portion.

Figure 3:
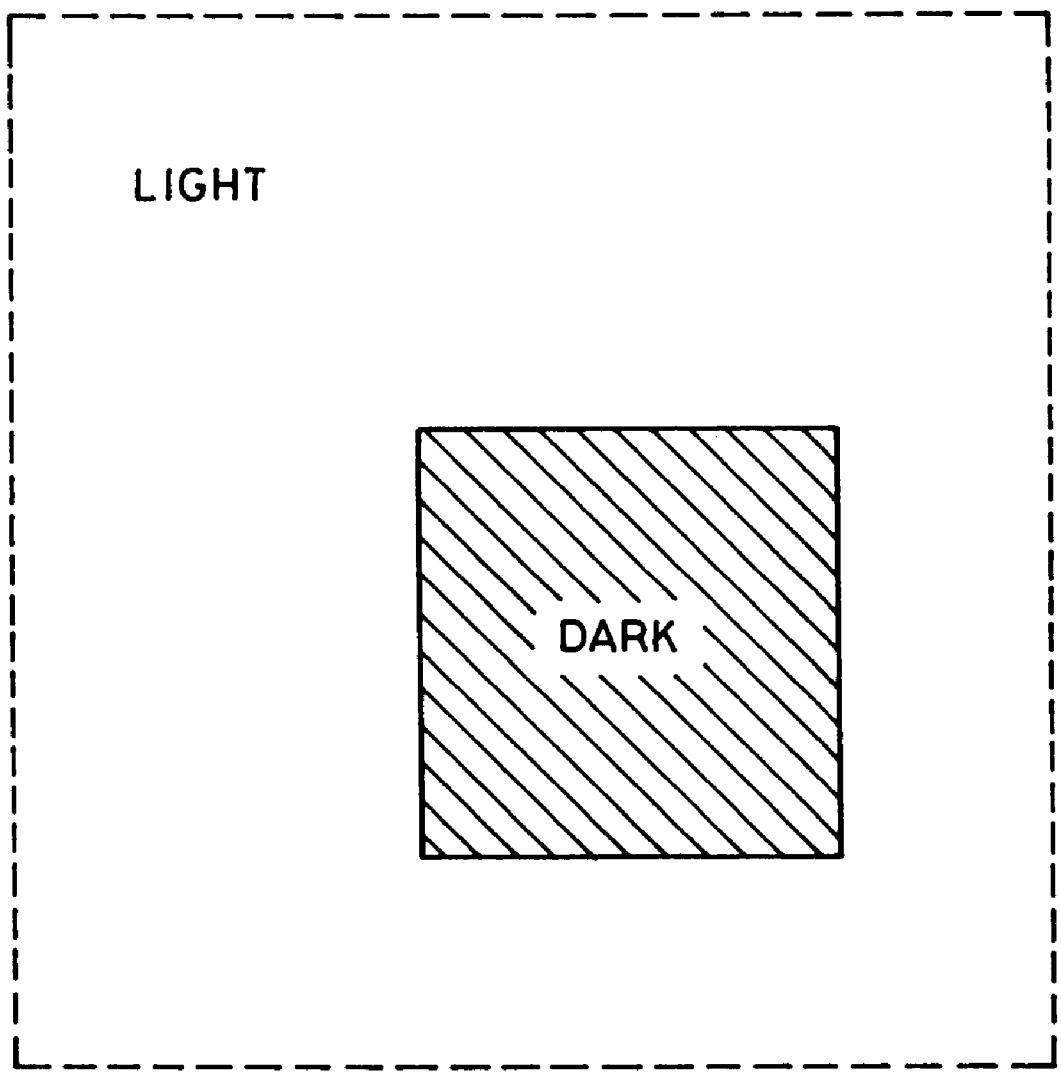
FIG. 3 is a schematic diagram illustrating a pattern of irregular luminance which can be superimposed on the data pattern image of FIG. 2.

It is therefore possible to detect the amount and distribution of irregular luminance over the entire page including all of white and black portions. For example, irregular luminance including a "dark" portion as illustrated in FIG. 3 can be detected as the amount and distribution with respect to the entire page.

The irregular luminance thus detected may be represented in the form of two-dimensional data in units of pages. Then, the two-dimensional data carrying the irregular luminance is standardized, a correction coefficient (i.e., corresponding to a coefficient for reducing the deviation to zero) is calculated and stored for each pixel, and data on a corresponding normal recording page is multiplied by the correction coefficient to remove the irregular luminance.

According to this embodiment, irregular luminance is detected in a page, and the value of corresponding data is corrected to remove the irregular luminance. Thus, irregular luminance between holograms caused by an uneven light source, interference fringes remaining in optics, and the characteristics of recording materials is removed, so that reproduced data can be reliably provided while reducing read errors. Furthermore, by combining the data reproduction processing unique to the respective embodiments described above, such as that at Step S36, the irregular luminance can be processed such that a rough compensation is first made and then followed by a fine compensation, thereby making it possible to more reliably reproduce a digital signal.

While the respective embodiments described above have employed only a holographic memory medium as a recording medium, the present invention is not necessarily limited to this particular recording medium.

While a variety of means and steps have been explained in a limited manner in the respective embodiment described above, they may be appropriately modified within a scope in which those skilled in the art may design.

According to the present invention as described above in detail, a recorded digital signal can be reliably reproduced even if a read signal is experiencing level fluctuations due to noise.

The present invention has been described with reference to the preferred embodiments thereof. It should be understood that a variety of alterations and modifications may be contemplated by those skilled in the art. It is intended that all such variations and modifications are encompassed in the appended claims.

What is claimed is:

1. A method of recording a plurality of digital signal sequences at predetermined unitary recording areas in a recording medium, respectively, comprising:
    transforming each of said digital signal sequences to be recorded into blocks, wherein said blocks respectively have predetermined shapes and predetermined orientations within a corresponding predetermined unitary recording area;
    including a plurality of bit data carrying all digit levels to be read upon reproduction within each of said blocks; and
    recording a sequence of said blocks at said corresponding predetermined unitary recording area in said recording medium.

2. A digital signal recording method according to claim 1, wherein said data block is formed of the number of bits corresponding to a vertical length by which a recording plane in said recording medium is divided, and the number of bits corresponding to a horizontal length by which the recording plane in said recording medium is divided.

3. A digital signal recording method according to claim 1, wherein said data block is formed of the number of bits corresponding to a vertical length by which a recording plane in said recording medium is divided, the number of bits corresponding to a horizontal length by which the recording plane in said recording medium is divided, and the number of bits corresponding to a recording time interval for a recording area defined by both of said numbers of bits.

4. The method as claimed in claim 1, wherein said blocks are respectively located at predetermined positions within said corresponding predetermined unitary recording area.

5. The method as claimed in claim 4, wherein predetermined shapes, predetermined orientations, and predetermined positions of blocks included in a plurality of subsequent predetermined unitary recording areas are respectively equivalent to said predetermined shapes, said predetermined orientations, and said predetermined positions of said blocks in said corresponding predetermined unitary recording area.

6. The method as claimed in claim 1, wherein said predetermined shapes of all of said blocks within said corresponding predetermined unitary recording area are equal.

7. The method as claimed in claim 6, wherein predetermined sizes of all of said blocks within said corresponding predetermined unitary recording area are equal.

8. A method of reproducing digital signal sequences from a recording medium, comprising:
    recognizing blocks in each of read signal sequences obtained from said recording medium;
    determining a threshold value for each block on the basis of read values of bit data carrying all digit levels to be read and determined; and
    reading and determining each digit level of bit data of said read signal sequences on the basis of said threshold value.

9. The method as claimed in claim 8, wherein said blocks respectively have predetermined shapes and predetermined orientations within a corresponding predetermined unitary recording area.

10. The method as claimed in claim 9, wherein said blocks are respectively located at predetermined positions within said corresponding predetermined unitary recording area.

11. The method as claimed in claim 10, wherein predetermined shapes, predetermined orientations, and predetermined positions of blocks included in a plurality of subsequent predetermined unitary recording areas are respectively equivalent to said predetermined shapes, said predetermined orientations, and said predetermined positions of said blocks in said corresponding predetermined unitary recording area.

12. The method as claimed in claim 9, wherein said predetermined shapes of all of said blocks within said corresponding predetermined unitary recording area are equal.

13. The method as claimed in claimed 12, wherein predetermined sizes of all of said blocks within said corresponding predetermined unitary recording area are equal.

14. A method of recording a plurality of digital signal sequence at predetermined unitary recording areas in a recording medium, respectively, comprising:

transforming each of said digital signal sequences to be recorded into blocks, wherein said blocks respectively have predetermined shapes and predetermined orientations within a corresponding predetermined unitary recording area;

locating reference bit data carrying at least first and second digit levels to be read and determined upon reproduction at respective predetermined positions in each of said data blocks; and recording a sequence of said blocks at said corresponding predetermined unitary recording area in said recording medium.

15. A digital signal recording method according to claim 14, wherein said data block is formed of the number of bits corresponding to a vertical length by which a recording plane in said recording medium is divided, and the number of bits corresponding to a horizontal length by which the recording plane in said recording medium is divided.

16. A digital signal recording method according to claim 14, wherein said data block is formed of the number of bits corresponding to a vertical length by which a recording plane in said recording medium is divided, the number of bits corresponding to a horizontal length by which the recording plane in said recording medium is divided, and the number of bits corresponding to a recording time interval for a recording area defined by both of said numbers of bits.

17. The method as claimed in claim 16, wherein a first one of the reference data values is recorded in a first recording time interval and a second one of the reference data values is recorded in a second recording time interval.

18. The method as claimed in claim 14, wherein said blocks are respectively located at predetermined positions within said corresponding predetermined unitary recording area.

19. The method as claimed in claim 18, wherein predetermined shapes, predetermined orientations, and predetermined positions of blocks included in a plurality of subsequent predetermined unitary recording areas are respectively equivalent to said predetermined shapes, said predetermined orientations, and said predetermined positions of said blocks in said corresponding predetermined unitary recording area.

20. The method as claimed in claim 14, wherein said predetermined shapes of all of said blocks within said corresponding predetermined unitary recording area are equal.

21. The method as claimed in claim 20, wherein predetermined sizes of all of said blocks within said corresponding predetermined unitary recording area are equal.

22. A method of reproducing digital signal sequences from a recording medium:

recognizing blocks in each of read signal sequences obtained from said recording medium;

determining a threshold value for each of said blocks on the basis of read values of reference bit data carrying at least first and second digital levels to be read and determined, said reference bit data being located at predetermined positions within each of said blocks; and reading and determining each digit level of bit data of said read signal sequences on the basis of said threshold value.

23. The method as claimed in claim 22, wherein said blocks respectively have predetermined shapes and predetermined orientations within a corresponding predetermined unitary recording area.

24. The method as claimed in claim 23, wherein said blocks are respectively located at predetermined positions within said corresponding predetermined unitary recording area.

25. The method as claimed in claim 24, wherein predetermined shapes, predetermined orientations, and predetermined positions of blocks included in a plurality of subsequent predetermined unitary recording areas are respectively equivalent to said predetermined shapes, said predetermined orientations, and said predetermined positions of said blocks in said corresponding predetermined unitary recording area.

26. The method as claimed in claim 23, wherein said predetermined shapes of all of said blocks within said corresponding predetermined unitary recording area are equal.

27. The method as claimed in claim 26, wherein predetermined sizes of all of said blocks within said corresponding predetermined unitary recording area are equal.

28. A method of reproducing data from a recording medium, comprising:

(a) dividing at least one predetermined unitary recording area into a first block to an Nth block, wherein each of said first block to said Nth block contains a plurality of data values;

(b) obtaining a threshold value for said first block, wherein said threshold value is obtained based on a plurality of data values within said first block;

(c) comparing said data values within said first block to said threshold value;

(d) identifying said data values within said first block that are greater than said threshold value as a first digit level; and (e) identifying said data values within said first block that are less than said threshold value as a second digit level.

29. The method as claimed in claim 28, further comprising:

(f) repeating said operations (b) to (e) for remaining blocks of said first block to said Nth block.

30. The method as claimed in claim 28, further comprising:

(f) repeating said operations (b) to (j) for remaining blocks of said first block to said Nth block.

31. The method as claimed in claim 28, wherein said threshold value is determined based on an average of said data values in said first block.

32. The method as claimed in claim 28, further comprising:

(f) calculating a first average value of said data values within said first block that have been identified as said first digit level;

(g) calculating a second average value of said data values within said first block that have been identified as said second digit level;

(h) calculating a refined threshold level based on said first average value and said second average value; and (i) identifying said data values within said first block that are greater than said refined threshold value as a refined first digit level; and (j) identifying said data values within said first block that are less than said refined threshold value as a refined second digit level.

33. The method as claimed in claim 32, wherein said refined threshold value is determined based on an average of said first average value and said second average value.

34. The method as claimed in claim 28, wherein said operation (b) comprises:
   (b1) extracting a first reference value from said first block, wherein said first reference value corresponds to said first digit level;
   (b2) extracting a second reference value from said first block, wherein said second reference value corresponds to said second digit level; and
   (b3) obtaining said threshold value for said first block, wherein said threshold value is obtained based on said first reference value and said second reference value.

35. The method as claimed in claim 34, wherein said threshold value is obtained based on an average of said first reference value and said second reference value.

36. A method of recording data in predetermined unitary recording areas in a recording medium, comprising:
   (a) forming a first block containing a plurality of data values;
   (b) adding at least one reference data value to said first block to ensure said first block has at least one data value corresponding to all possible digit levels of said first block;
   (c) recording said first block in at least a first predetermined unitary recording area.

37. The method as claimed in claim 36, further comprising:
   (d) forming a second block to an Nth block, wherein each of said second block to said Nth block comprises a plurality of data values; and
   (e) repeating said operations (b) and (c) for said second block to said Nth block.

38. The method as claimed in claim 37, wherein said operation (b) comprises:
   (b1) adding a plurality of reference data values to said first block, wherein said plurality of said reference data values corresponds to all possible digit levels of said first block.

* * * * *